(12) United States Patent
Balasubramanian et al.

(10) Patent No.: US 6,235,591 B1
(45) Date of Patent: May 22, 2001

(54) METHOD TO FORM GATE OXIDES OF DIFFERENT THICKNESSES ON A SILICON SUBSTRATE

(75) Inventors: Narayanan Balasubramanian, Singapore; Yelehanka Ramachandamurthy Pradeep, Singapore; Jia Zhen Zheng, Singapore; Alan Cuthbertson, The Blossomvale, all of (SG)

(73) Assignee: Chartered Semiconductor Manufacturing Company, Singapore (SG)

( * ) Notice: Subject to any disclaimer, the term of this patent is extended or adjusted under 35 U.S.C. 154(b) by 0 days.

(21) Appl. No.: 09/425,904

(22) Filed: Oct. 25, 1999

(51) Int. Cl.$^7$ ................................. H01L 21/8234
(52) U.S. Cl. ..................... 438/275; 438/229; 438/770; 438/775
(58) Field of Search ..................... 438/275, 199, 438/229, 770, 775; 148/DIG. 13

(56) References Cited

U.S. PATENT DOCUMENTS

| | | | |
|---|---|---|---|
| 5,057,449 | 10/1991 | Lowrey et al. | 437/60 |
| 5,254,489 | * 10/1993 | Nakata . | |
| 5,502,009 | 3/1996 | Lin | 437/239 |
| 5,576,226 | * 11/1996 | Hwang . | |
| 5,668,035 | 9/1997 | Fang et al. | 438/239 |
| 5,716,863 | 2/1998 | Arai | 437/41 |
| 5,882,993 | 3/1999 | Gardner et al. | 438/591 |
| 5,960,289 | * 9/1999 | Tsui et al. . | |
| 5,989,962 | * 11/1999 | Holloway et al. . | |

* cited by examiner

*Primary Examiner*—Long Pham
(74) *Attorney, Agent, or Firm*—George O. Saile; Rosemary L. S. Pike

(57) ABSTRACT

A method of fabricating gate oxides of different thicknesses has been achieved. Active area isolations are provided in a silicon substrate to define low voltage sections and high voltage sections in the silicon substrate. A sacrificial oxide layer is formed overlying the silicon substrate. A silicon nitride layer is deposited overlying the sacrificial oxide layer. A masking oxide layer is deposited overlying the silicon nitride layer. The masking oxide layer is patterned to form a hard mask overlying the low voltage sections. The silicon nitride layer is etched through where exposed by the hard mask thereby exposing the sacrificial oxide layer overlying the high voltage section. The exposed sacrificial oxide layer and the hard mask are etched away. A thick gate oxide layer is grown overlying the silicon substrate in the high voltage section. The silicon nitride layer is etched away. The sacrificial oxide layer overlying the low voltage section is etched away. A thin gate oxide layer is grown overlying the silicon substrate in the low voltage section, and the integrated circuit device is completed.

20 Claims, 7 Drawing Sheets

METHOD TO FORM GATE OXIDES OF DIFFERENT THICKNESSES ON A SILICON SUBSTRATE

BACKGROUND OF THE INVENTION (1) Field of the Invention

The invention relates to a method of fabricating semiconductor structures, and more particularly, to the formation of gate oxides of different thicknesses on a silicon substrate in the manufacture of integrated circuit devices.

(2) Description of the Prior Art

Ultra Large-Scale Integration (ULSI) technology has advanced to a point where the smallest, highest speed MOS devices have very thin gate oxides (less than 50 Angstroms). In the current technology, the voltage supply to these high speed devices is typically limited to just above 3 volts. This limitation is imposed to minimize switching times and because the very thin gate oxides could easily be damaged by a higher supply voltage.

This low voltage limitation is not adequate to the input/output (I/O) requirements of the integrated circuit. Many devices external to the integrated circuit operate in a 5 volt regime. Therefore, the very thin gate oxide technology is not sufficient to provide the (I/O) capability required for a most cost efficient integrated circuit.

Techniques have been developed to fabricate both a very thin (less than 50 Angstroms) gate oxide and a thicker (greater than 50 Angstrom) gate oxide on the same circuit. Application of these techniques allows the integrated circuit designer to provide both state of the art speed and packing density and necessary I/O on the same circuit.

Referring to FIG. 1, a cross-section of a partially completed prior art integrated circuit device is shown. A silicon substrate 10 is shown. A shallow trench isolation (STI) 14 is formed in the silicon substrate 10. The silicon substrate 10 is divided into two parts as indicated by the dash lines. The low voltage section 18 of the silicon substrate 10 will require the very thin oxide. The high voltage section 22 of the silicon substrate 10 will require the thicker oxide.

Referring now to FIG. 2, a first gate oxide layer 26 is grown overlying the silicon substrate 10 on both the low voltage section 18 and the high voltage section 22. The first gate oxide layer 26 is grown to a thickness somewhat greater than will be needed by the high voltage section 22. In this example, approximately 80 Angstroms of silicon dioxide is grown in the first gate oxide layer 26.

Referring now to FIG. 3, a photoresist layer 30 is deposited overlying the first gate oxide layer 26. The photoresist layer 30 is patterned to expose the first gate oxide layer 26 overlying the low voltage section 18.

Referring now to FIG. 4, the exposed first gate oxide layer 26 is etched away. Because of the thickness of the oxide, a buffered oxide etch (BOE) is used as is conventional in the art.

Referring to FIG. 5, the photoresist layer 30 is now stripped away. The strip may be by plasma stripping (ashing) or by a wet strip.

Referring now to FIG. 6, a pre-gate clean typically is performed. The purpose of the pre-gate clean is to purge the silicon surface of any remaining contaminants from the BOE etch and to prepare the surface for thermal oxidation of a high quality gate oxide. During the pre-gate clean step, the thickness of the thicker gate oxide layer 26 overlying the high voltage section 22 is reduced. In this example, the thicker gate oxide layer 26 remaining after the clean is about 60 Angstroms.

Referring now to FIG. 7, a thermal gate oxidation is performed. A very thin gate oxide layer 34 is grown overlying the low voltage section 18. Approximately 30 Angstroms of silicon dioxide is grown. Meanwhile, the thicker gate oxide layer increases in thickness to a final value of about 65 Angstroms.

While the prior art technique does create gate oxide layers of different thicknesses suitable for low and high voltage circuits, it has several disadvantages. First, because the photoresist layer 30 is coated directly over the thicker gate oxide layer 26, the quality of the thicker gate oxide layer 26 is jeopardized. Second, the buffered oxide etch that must be used to etch away the relatively thick first gate oxide layer 26, is more difficult to control than, for example, a pre-gate clean. Damage to the silicon substrate 10 in the low voltage section 18 may result. This damage is detrimental to the formation of a very high quality oxide. Finally, exposure of the silicon substrate 10 to the photoresist stripping process, whether plasma or wet etch, can damage the silicon substrate 10. Again, this can cause problems for the silicon dioxide gate that will be grown there.

Several prior art approaches disclose methods to form gate oxides of different thicknesses in the fabrication of integrated circuits. U.S. Pat. No. 5,502,009 to Lin discloses a process to fabricate gate oxides of different thicknesses. The first embodiment grows a common thin gate oxide over both low voltage sections and high voltage sections. Silicon nitride is deposited, patterned, and used as a hard mask to etch away the thin gate oxide layer from the high voltage section. A thick gate oxide is then grown over the high voltage section. The silicon nitride is then etched away. In the second embodiment, a silicon dioxide layer is added overlying the silicon nitride layer. This silicon dioxide layer is patterned and to form a hard mask for etching the silicon nitride layer. In both embodiments, only the thicker gate oxide is re-grown. The thin gate oxide that is grown at the beginning of the sequence is not re-grown. U.S. Pat. No. 5,057,449 to Lowrey et al teaches a process to create gate oxides of different thicknesses for DRAMs. Prior to field oxidation, a thick gate oxide is grown. This oxide is patterned using photoresist. The photoresist is stripped, and the thin gate oxide layer is grown. A silicon nitride layer is used to shield the thin and thick gate oxides during subsequent field oxidation. U.S. Pat. No. 5,882,993 to Gardner et al discloses a process to form gate oxides of different thicknesses. A nitrogen impurity concentration is introduced into selective portions of the silicon substrate. During the gate oxide thermal oxidation, silicon dioxide grows more slowly over nitrogen-rich areas of silicon. U.S. Pat. No. 5,668,035 to Fang et al teaches a process to form gate oxides of different thicknesses for DRAM applications. A thick gate oxide is grown over logic and DRAM sections. Polysilicon is deposited and patterned. The gate oxide is etched away from the logic areas using the polysilicon layer as a mask. A thin gate oxide is then grown over the logic sections. U.S. Pat. No. 5,716,863 to Arai discloses a process to create gate oxides of different thicknesses using a polysilicon mask layer.

SUMMARY OF THE INVENTION

A principal object of the present invention is to provide an effective and very manufacturable method of forming gate oxides of different thickness in the manufacture of integrated circuits.

A further object of the present invention is to provide a method to fabricate gate oxides of different thickness that eliminates coating photoresist directly onto the gate oxide.

Another further object of the present invention is to provide a method to fabricate gate oxides of different thickness that eliminates etching away by buffered oxide etching a temporary gate oxide layer from the surface of the silicon substrate where a permanent gate oxide will be grown.

Another further object of the present invention is to provide a method to fabricate gate oxides of different thickness that prevents photoresist stripping processes from damaging the silicon substrate surface prior to formation of gate oxide.

In accordance with the objects of this invention, a new method of fabricating gate oxides of different thicknesses has been achieved. Active area isolations are provided in a silicon substrate to define low voltage sections and high voltage sections in the silicon substrate. A sacrificial oxide layer is formed overlying the silicon substrate. A silicon nitride layer is deposited overlying the sacrificial oxide layer. A masking oxide layer is deposited overlying the silicon nitride layer. The masking oxide layer is patterned to form a hard mask overlying the low voltage sections. The silicon nitride layer is etched through where exposed by the hard mask thereby exposing the sacrificial oxide layer overlying the high voltage section. The exposed sacrificial oxide layer and the hard mask are etched away. A thick gate oxide layer is grown overlying the silicon substrate in the high voltage section. The silicon nitride layer is etched away. The sacrificial oxide layer overlying the low voltage section is etched away. A thin gate oxide layer is grown overlying the silicon substrate in the low voltage section, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

This embodiment discloses the application of the present invention to the formation of gate oxides of different thicknesses in the fabrication of an integrated circuit device. The present invention can easily be applied to form two different thicknesses of oxide. It should be clear to those experienced in the art that the present invention can be applied and extended, for example, to form three or more thicknesses of gate oxide, without deviating from the scope of the present invention.

Figure 1:
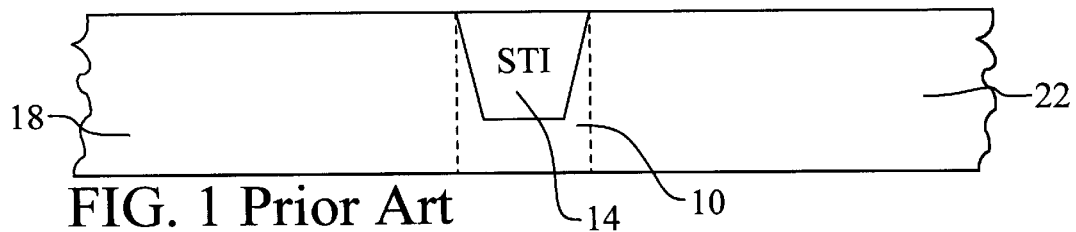
FIGS. 1 through 7 schematically illustrate in cross-section a partially completed prior art integrated circuit device. A process to form gate oxides of two thicknesses is depicted.
Figure 2:
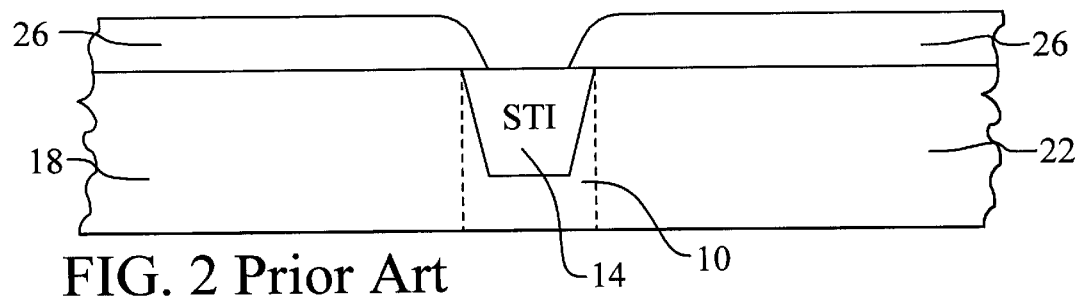
Figure 3:
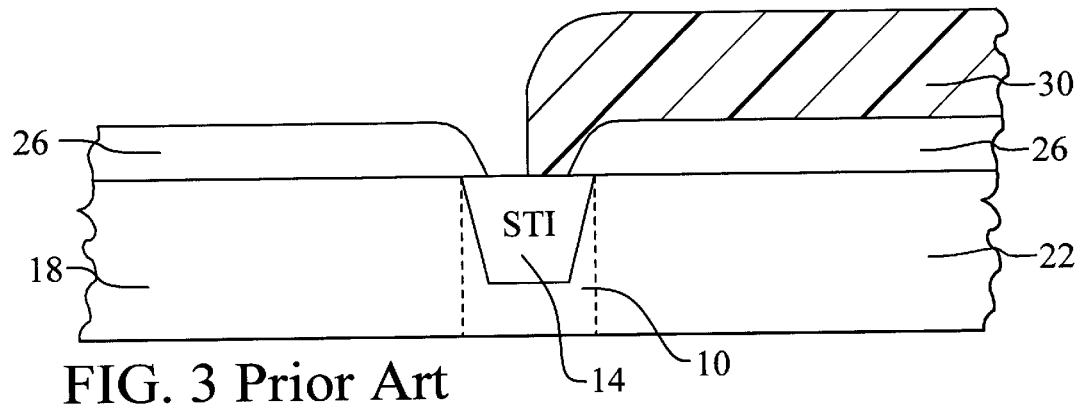
Figure 4:
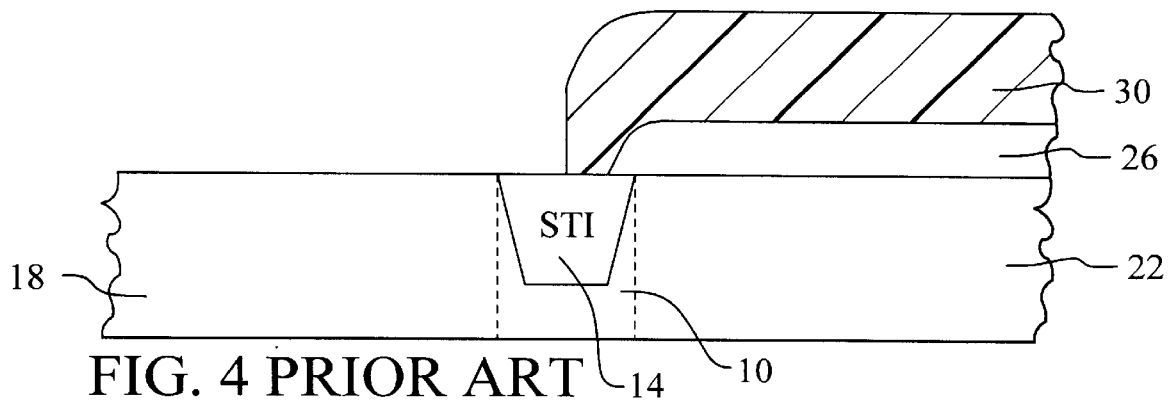
Figure 5:
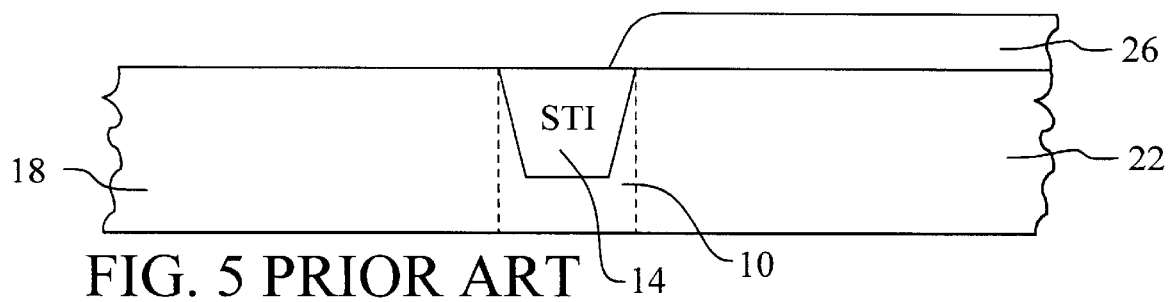
Figure 6:
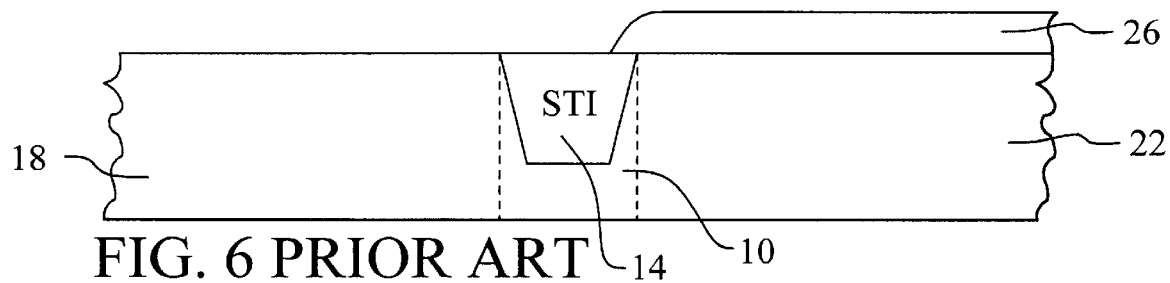
Figure 7:
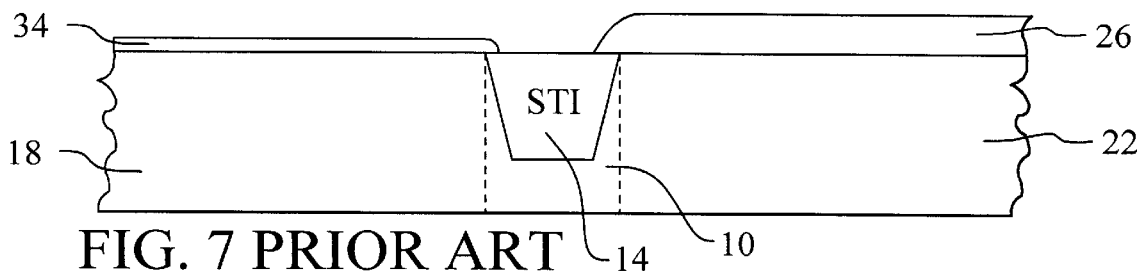
Figure 8:
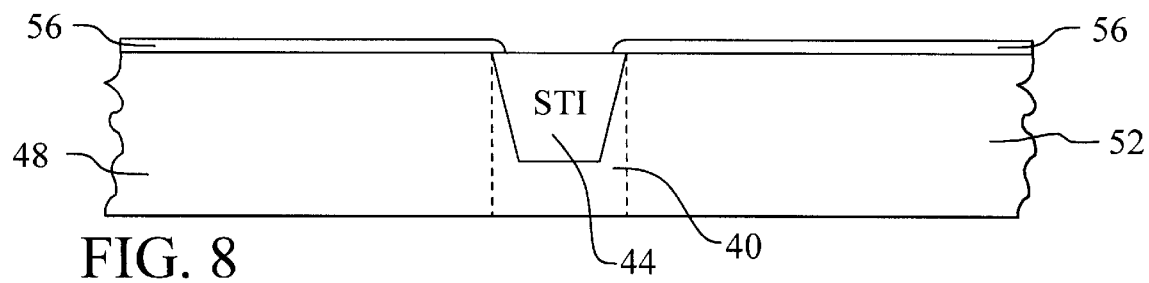
FIGS. 8 through 19 schematically illustrate in cross-sectional representation a preferred embodiment of the present invention.

Referring now particularly to FIG. 8, there is shown a cross section of a partially completed integrated circuit device of the preferred embodiment. A silicon substrate 40 is used. Active area isolations 44, such as local oxidation of silicon (LOCOS) or shallow trench isolations (STI), are formed in the silicon substrate 40. The active area isolations 44 divide the silicon substrate 40 into different sections. Representative of the circuit as a whole, the schematic shows the silicon substrate 40 divided into two sections as indicated by the dash lines. The low voltage section 48 will require a thinner oxide. The high voltage section 52 will require the thicker oxide. A sacrificial oxide layer 56 is formed overlying the silicon substrate 40. The sacrificial oxide layer may be formed by thermal oxidation, rapid thermal oxidation (RTO), or by chemical vapor deposition (CVD). The purpose of the sacrificial oxide layer 56 is to protect the surface of the silicon substrate 40 from damage during the processing steps necessary to form the gate oxides of different thickness. The sacrificial oxide layer 56 is preferably formed as thin as possible. By keeping the oxide thin, it is possible to remove the sacrificial oxide layer 56 using a simple pre-gate clean (diluted HF). This prevents further damage and contamination problems. In the preferred embodiment, the sacrificial oxide layer 56 is formed using thermal oxidation of silicon in a furnace or rapid thermal oxidation (RTO) chamber. The sacrificial oxide layer 56 is formed to a thickness of between about 20 Angstroms and 40 Angstroms.

Figure 9:
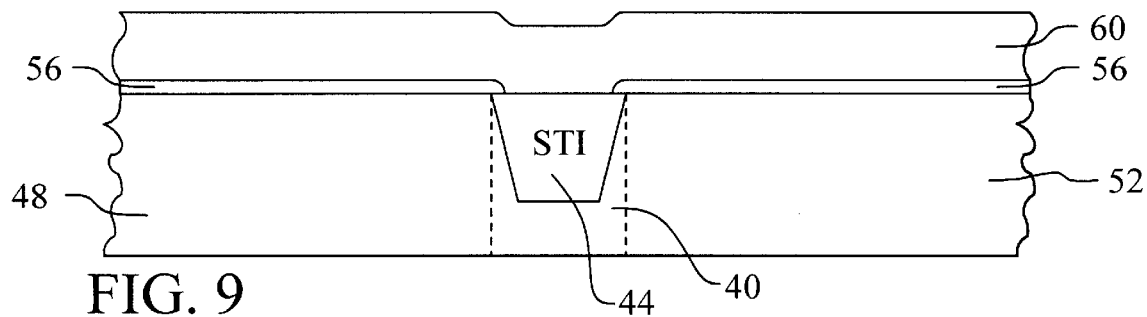

Referring now to FIG. 9, a silicon nitride layer 60 is deposited overlying the sacrificial oxide layer 56. The purpose of the silicon nitride layer 60 is to provide a hard mask for etching away the sacrificial oxide layer 56 in a subsequent process step. In the preferred embodiment, the silicon nitride layer 60 is deposited by a low-pressure CVD (LPCVD) process to a thickness of between about 60 Angstroms and 100 Angstroms.

Figure 10:
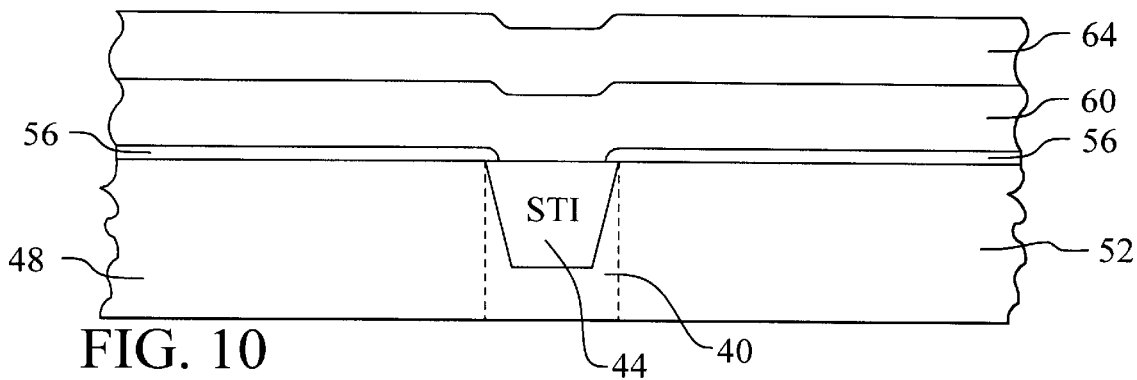

Referring now to FIG. 10, a masking oxide layer 64 is deposited overlying the silicon nitride layer 60. The purpose of the masking oxide layer 64 is to provide a hard mask for the etching of the silicon nitride layer 56 in a subsequent step. The masking oxide layer 64 is preferably composed of silicon dioxide deposited by LPCVD using a tetraethoxysilane source. The masking oxide layer 64 is preferably deposited to a thickness of between about 130 Angstroms and 270 Angstroms.

Figure 11:
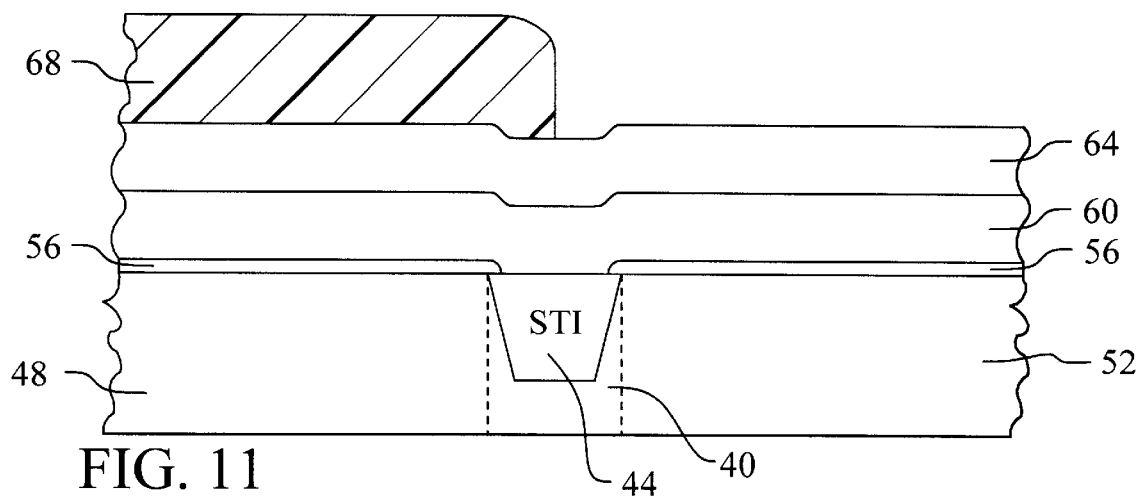

Referring now to FIG. 11, a photoresist layer 68 is deposited overlying the masking oxide layer 64. The photoresist layer 68 is conventionally patterned to uncover the masking oxide layer 64 overlying the high voltage sections 52. While photoresist is currently used to define the patterns in the preferred embodiment, other approaches could be used.

Figure 12:
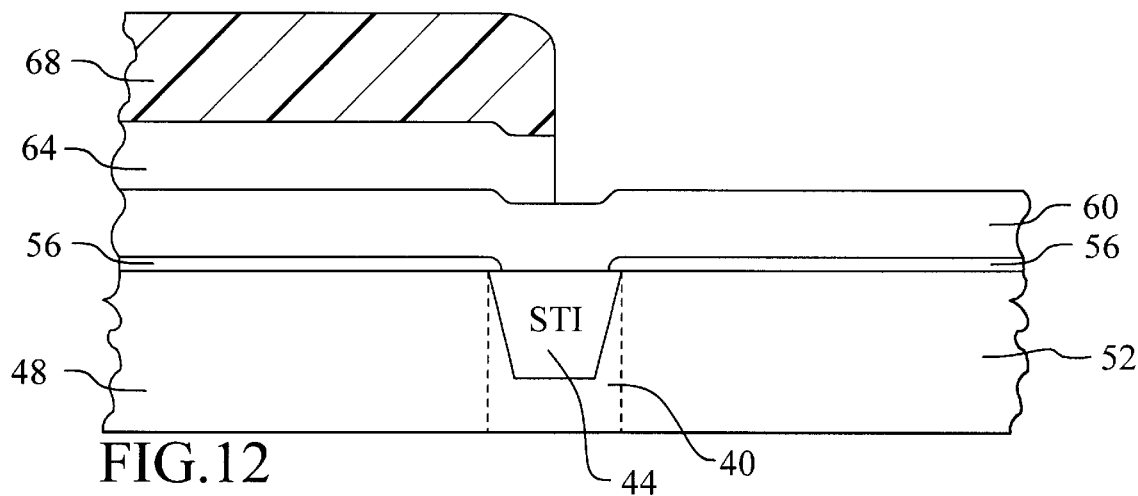

Referring now to FIG. 12, the masking oxide layer 64 is patterned to form a hard mask overlying the low voltage sections 48. The photoresist layer 68 is used here to mask the masking oxide layer 64 from a buffered oxide etch (BOE) process. The masking oxide layer 64 is completely etched away overlying the high voltage sections 52. Here we see the advantage of using both the masking oxide layer 64 and the silicon nitride layer 60. The difficult to control BOE process never contacts either the sacrificial gate oxide layer 56 or the silicon substrate. Therefore, damage to the permanent gate oxide, which will be grown later, is avoided.

Figure 13:
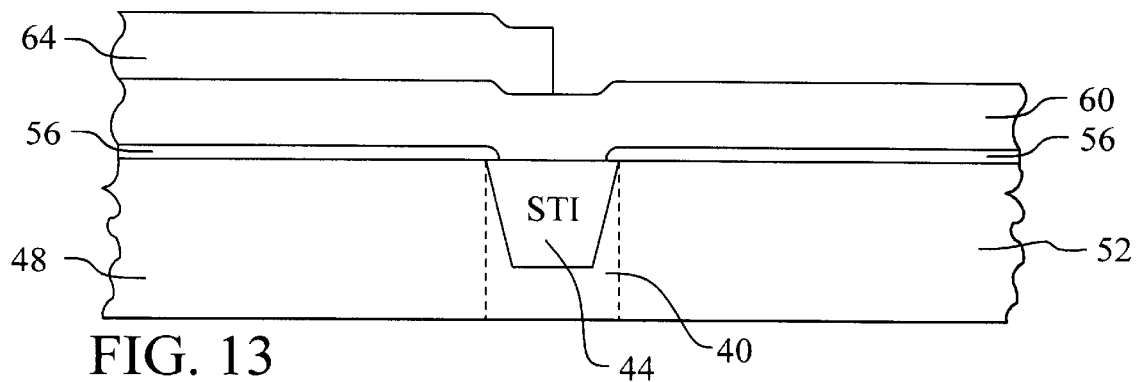

Referring now to FIG. 13, the photoresist layer 68 is stripped away. The stripping process can be either a plasma strip (ashing) or a chemical wet strip. Again, because the silicon nitride layer 60 covers the sacrificial oxide layer 56 and the silicon substrate 40, no damage occurs.

Figure 14:
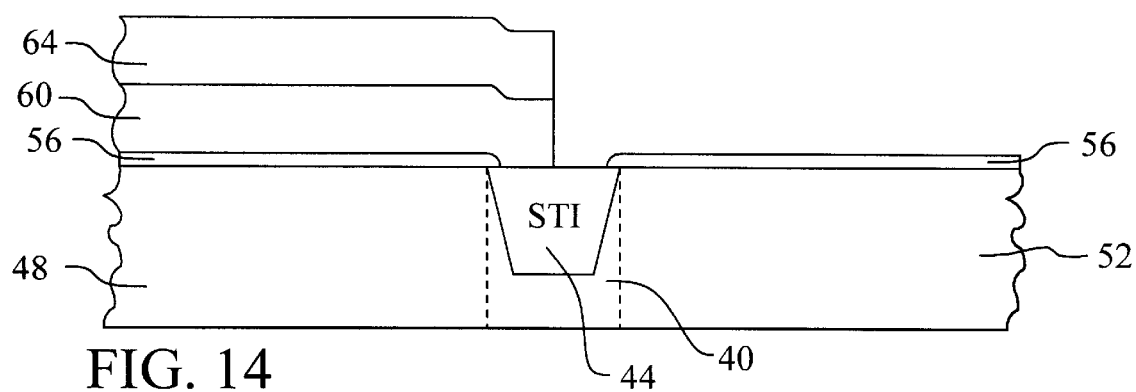

Referring now to FIG. 14, the silicon nitride layer 60 is etched through where exposed by the hard mask 64 thereby exposing the sacrificial oxide layer 56 overlying the high voltage section 52. The silicon nitride layer 60 is etched using, for example, phosphoric acid ($H_3PO_4$). The phosphoric acid attacks only the silicon nitride layer 60 while leaving the silicon dioxide structures unharmed.

Figure 15:
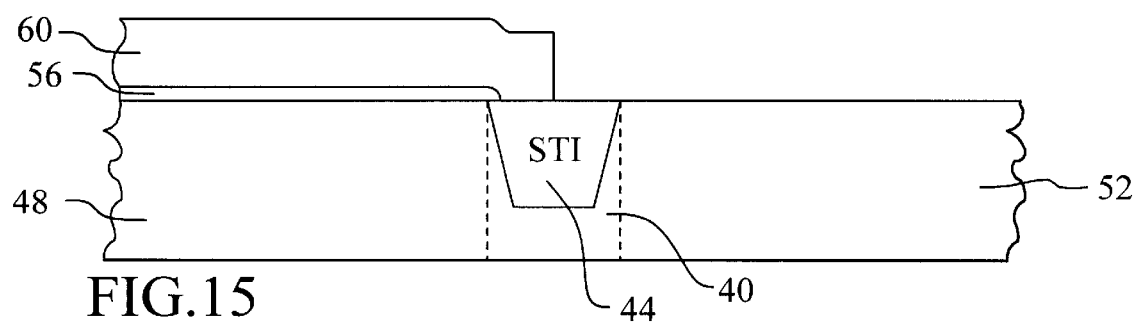

Referring now to FIG. 15, the exposed sacrificial oxide layer 56 and the hard mask 64 are etched away. A simple pre-gate clean process is used to remove both the sacrificial oxide layer 56 and the hard mask (masking oxide layer) 64. In the preferred embodiment, the pre-gate clean process consists of an approximately 100:1 diluted HF solution that etches the wafers for between about 45 seconds and 100 seconds. Because a relatively thin sacrificial oxide layer 56 is used, the pre-gate clean process is sufficient to remove the silicon dioxide from the surface of the silicon substrate. This is a better process to use, compared to a BOE process, since it is the same one used for preparing silicon surfaces for gate oxidation generally.

Figure 16:
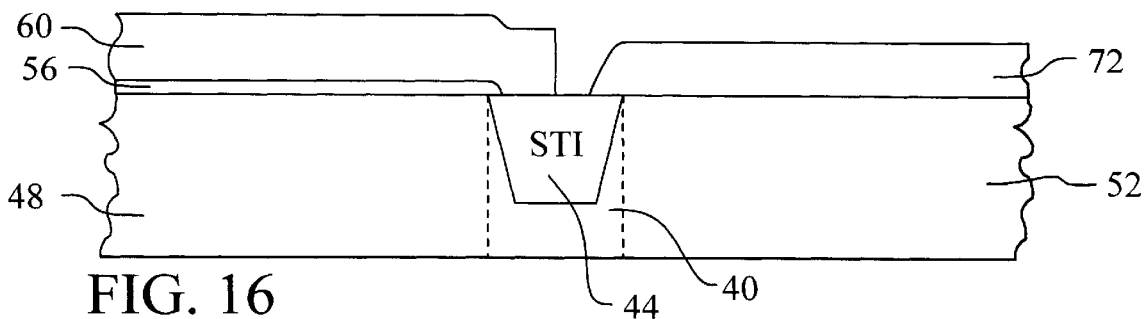

Referring now to FIG. 16, a thick gate oxide layer 72 is grown overlying the silicon substrate 40 in the high voltage section 52. The thick gate oxide layer 72 is a very high quality oxide. In the preferred embodiment, the thick gate oxide layer 72 is grown to a thickness of between about 60 Angstroms and 150 Angstroms. By completely stripping the sacrificial oxide layer 56 from the high voltage section 52 before re-growing the thick gate oxide layer 72 from the surface of the silicon substrate, rather than growing additional oxide over the sacrificial oxide layer 56, the quality of the gate oxide is improved.

Figure 17:
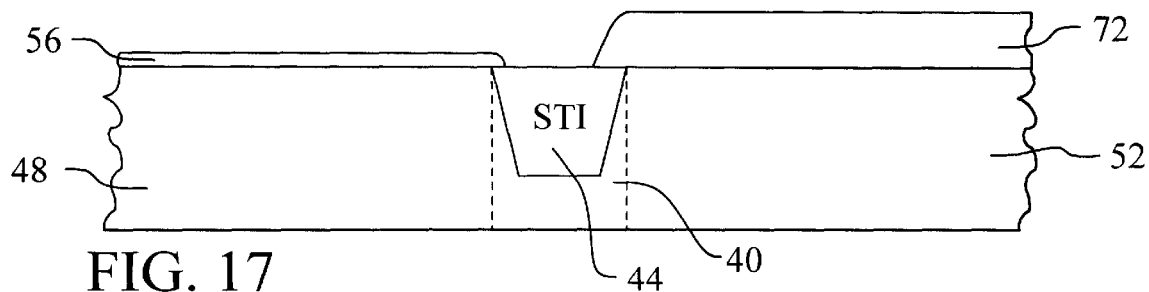

Referring now to FIG. 17, the silicon nitride layer 60 is etched away. A phosphoric acid ($H_3PO_4$) is preferably used to remove the remaining silicon nitride layer 60 without etching the silicon dioxide structures.

Figure 18:
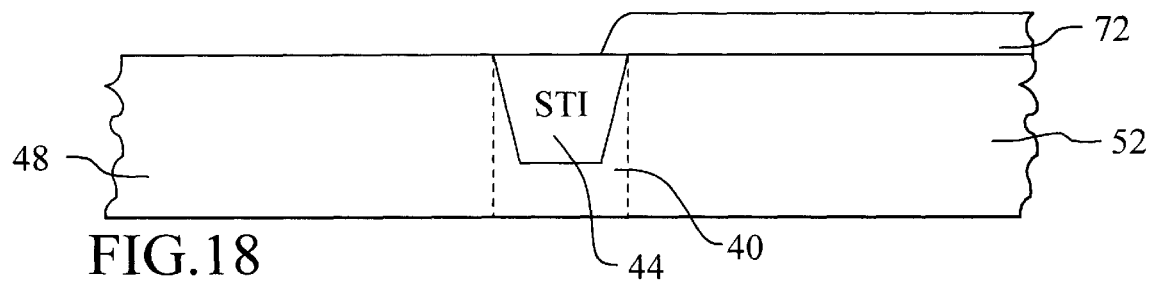

Referring now to FIG. 18, the sacrificial oxide layer 56 overlying the low voltage section 48 is etched away. The remaining sacrificial oxide layer 48 is etched away using a simple pre-gate clean process. In the preferred embodiment, the pre-gate clean process consists of an approximately 100:1 diluted HF solution that etches the wafers for between about 45 seconds and 50 seconds. Again, this is a better process to use, compared to a BOE process, since it is the same process used for preparing silicon surfaces for gate oxidation. In addition to removing the sacrificial gate oxide layer 56, the thickness of the thick gate oxide layer 72 is also reduced by between about 18 Angstroms and 22 Angstroms.

Figure 19:
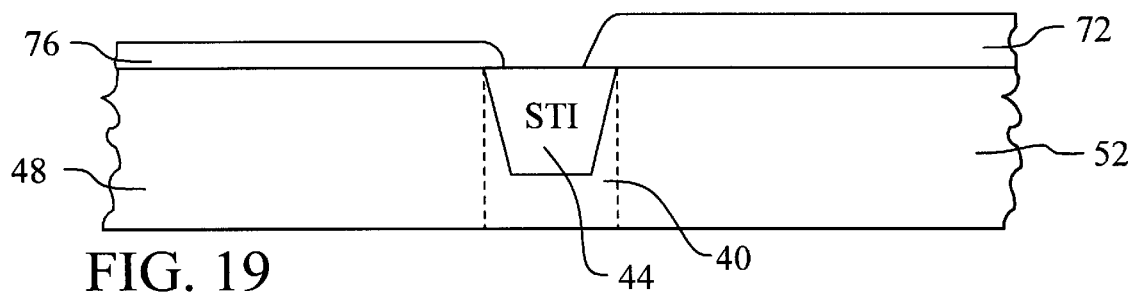

Referring now to FIG. 19, a thin gate oxide layer 76 is grown overlying the silicon substrate 40 in the low voltage section 48, and the integrated circuit device is completed. The thin gate oxide layer 76 is a very high quality oxide. In the preferred embodiment, the thin gate oxide layer 76 is grown to a thickness of between about 20 Angstroms and 45 Angstroms. During the growth of the thin gate oxide layer 76, the thickness of the thick gate oxide layer 72 is also increased to achieve a final thickness of between about 40 Angstroms and 137 Angstroms. By completely stripping the oxide from the low voltage section 48 and re-growing the thin gate oxide layer 76 from the surface of the silicon substrate, rather than growing additional oxide over the sacrificial oxide layer 56, the quality of the gate oxide is improved.

At the conclusion of the process sequence, two very high quality gate oxides have been formed. Each gate oxide can be custom tailored to the particular demands of the device application. The novel process method eliminates damage to the gate oxides from contact with either photoresist or photoresist stripping process. Damage to the silicon substrate from BOE processes is likewise eliminated by using only pre-gate cleans to remove oxide. Finally, the quality of each oxide is improved by completely removing the sacrificial oxide layer and regrowing a new gate oxide.

As shown in the preferred embodiment, the present invention provides a very manufacturable process for fabricating gate oxides of different thicknesses in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method for fabricating gate oxide layers of different thicknesses in the manufacture of an integrated circuit device comprising:

providing active area isolations to define at least one low voltage section and at least one high voltage section in a silicon substrate;

forming a sacrificial oxide layer overlying said silicon substrate;

depositing a silicon nitride layer overlying said sacrificial oxide layer;

depositing a masking oxide layer overlying said silicon nitride layer;

patterning said masking oxide layer to form a hard mask overlying said low voltage section;

etching through said silicon nitride layer exposed by said hard mask and thereby exposing said sacrificial oxide layer overlying said high voltage section;

etching away said hard mask and all of said exposed sacrificial oxide layer overlying said high voltage section whereby said silicon substrate in said high voltage section is exposed and wherein no photoresist mask is used;

growing a thick gate oxide layer overlying said silicon substrate in said high voltage section;

etching away said silicon nitride layer to expose said sacrificial oxide layer overlying said low voltage section;

etching away all of said sacrificial oxide layer overlying said low voltage section whereby said silicon substrate in said low voltage section is exposed and wherein no photoresist mask is used;

growing a thin gate oxide layer overlying said silicon substrate in said low voltage section; and completing said integrated circuit device.

2. The method according to claim 1 wherein said sacrificial oxide layer is formed by one of the group comprising: thermal oxidation, rapid thermal oxidation, and chemical vapor deposition.

3. The method according to claim 1 wherein said sacrificial oxide layer is formed to a thickness of between about 20 Angstroms and 40 Angstroms.

4. The method according to claim 1 wherein said silicon nitride layer is deposited to a thickness of between about 60 Angstroms and 100 Angstroms.

5. The method according to claim 1 wherein said masking oxide layer is deposited to a thickness of between about 130 Angstroms and 270 Angstroms.

6. The method according to claim 1 wherein said step of etching away said hard mask and said exposed sacrificial oxide layer overlying said high voltage section is by a pre-gate clean process comprising a wet etch using an approximately 100:1 diluted HF solution that etches the wafers for between about 45 seconds and 100 seconds.

7. The method according to claim 1 wherein said thick gate oxide layer is grown to a thickness of between about 60 Angstroms and 150 Angstroms.

8. The method according to claim 1 wherein said step of etching away said sacrificial oxide layer overlying said low voltage section is by a pre-gate clean process comprising a wet etch using an approximately 100:1 diluted HF solution that etches the wafers for between about 45 seconds and 50 seconds.

9. The method according to claim 1 wherein said thin gate oxide layer is grown to a thickness of between about 20 Angstroms and 45 Angstroms.

10. A method for fabricating gate oxide layers of different thicknesses in the manufacture of an integrated circuit device comprising:

provided active area isolations to define at least one low voltage section and at least one high voltage section in a silicon substrate;

forming a sacrificial oxide layer overlying said silicon substrate;

depositing a silicon nitride layer overlying said sacrificial oxide layer;

depositing a masking oxide layer overlying said silicon nitride layer;

patterning said masking oxide layer to form a hard mask overlying said low voltage section;

etching through said silicon nitride layer exposed by said hard mask and thereby exposing said sacrificial oxide layer overlying said high voltage section;

etching away said hard mask and all of said exposed sacrificial oxide layer overlying said high voltage section wherein said etching away is by a pre-gate clean process comprising a wet etch using an approximately 100:1 diluted HF solution that etches the wafers for between about 45 seconds and 100 seconds and whereby said silicon substrate in said high voltage section is exposed and wherein no photoresist mask is used;

growing a thick gate oxide layer overlying said silicon substrate in said high voltage section;

etching away said silicon nitride layer to expose said sacrificial oxide layer overlying said low voltage section;

etching away all of said sacrificial oxide layer overlying said low voltage section wherein said etching away is by a pre-gate clean process comprising a wet etch using an approximately 100:1 diluted HF solution that etches the wafers for between about 45 seconds and 50 seconds whereby said silicon substrate in said low voltage section is exposed and wherein no photoresist mask is used;

growing a thin gate oxide layer overlying said silicon substrate in said low voltage section; and completing said integrated circuit device.

11. The method according to claim 10 wherein said sacrificial oxide layer is formed by one of the group comprising: thermal oxidation, rapid thermal oxidation, and chemical vapor deposition.

12. The method according to claim 10 wherein said sacrificial oxide layer is formed to a thickness of between about 20 Angstroms and 40 Angstroms.

13. The method according to claim 10 wherein said silicon nitride layer is deposited to a thickness of between about 60 Angstroms and 100 Angstroms.

14. The method according to claim 10 wherein said thick gate oxide layer is grown to a thickness of between about 60 Angstroms and 150 Angstroms.

15. The method according to claim 10 wherein said thin gate oxide layer is grown to a thickness of between about 20 Angstroms and 45 Angstroms.

16. A method for fabricating gate oxide layers of different thicknesses in the manufacture of an integrated circuit device comprising:

providing active area isolations to define at least one low voltage section and at least one high voltage section in a silicon substrate;

forming a sacrificial oxide layer overlying said silicon substrate wherein said sacrificial oxide layer is formed to a thickness of between about 20 Angstroms and 40 Angstroms;

depositing a silicon nitride layer overlying said sacrificial oxide layer;

depositing a masking oxide layer overlying said silicon nitride layer;

patterning said masking oxide layer to form a hard mask overlying said low voltage section;

etching through said silicon nitride layer exposed by said hard mask and thereby exposing said sacrificial oxide layer overlying said high voltage section;

etching away said hard mask and all of said exposed sacrificial oxide layer overlying said high voltage section wherein said etching away is by a pre-gate clean process comprising a wet etch using an approximately 100:1 diluted HF solution that etches the wafers for between about 45 seconds and 100 seconds whereby said silicon substrate in said high voltage section is exposed and wherein no photoresist mask is used;

growing a thick gate oxide layer overlying said silicon substrate in said high voltage section;

etching away said silicon nitride layer to expose said sacrificial oxide layer overlying said low voltage section;

etching away all of said sacrificial oxide layer overlying said low voltage section wherein said etching away is by a pre-gate clean process comprising a wet etch using an approximately 100:1 diluted HF solution that etches the wafers for between about 45 seconds and 50 seconds whereby said silicon substrate in said high voltage section is exposed, wherein no photoresist mask is used, and whereby said thick gate oxide layer is partially etched down;

growing a thin gate oxide layer overlying said silicon substrate in said low voltage section; and completing said integrated circuit device.

17. The method according to claim 16 wherein said sacrificial oxide layer is formed by one of the group comprising: thermal oxidation, rapid thermal oxidation, and chemical vapor deposition.

18. The method according to claim 16 wherein said silicon nitride layer is deposited to a thickness of between about 60 Angstroms and 100 Angstroms.

19. The method according to claim 16 wherein said thick gate oxide layer is grown to a thickness of between about 60 Angstroms and 150 Angstroms.

20. The method according to claim 16 wherein said thin gate oxide layer is grown to a thickness of between about 20 Angstroms and 45 Angstroms.

* * * * *

UNITED STATES PATENT AND TRADEMARK OFFICE
CERTIFICATE OF CORRECTION

PATENT NO.    : 6,235,591 B1
DATED         : May 22, 2001
INVENTOR(S)   : Narayanan Balasubramanian, Yelehanka Ramachandramurthy Pradeep, Jia Zhen Zheng and Alan Cuthbertson It is certified that error appears in the above-identified patent and that said Letters Patent is hereby corrected as shown below:

Title page,
Item [75], delete "Ramachandamurthy" and replace with -- Ramachandramurthy --.
The last inventor, Alan Cuthbertson's address should read -- Singapore, Singapore --, please delete "the Blossomvale" and correct.

Signed and Sealed this

Seventh Day of May, 2002

*Attest:*

JAMES E. ROGAN
*Attesting Officer*   *Director of the United States Patent and Trademark Office*